United States Patent [19]

Kim et al.

[11] Patent Number: 5,114,873
[45] Date of Patent: May 19, 1992

[54] METHOD FOR MANUFACTURING A STACKED CAPACITOR DRAM CELL

[75] Inventors: Kyung-hun Kim; Seong-tae Kim; Hyeong-kyu Lee, all of Seoul, Rep. of Korea

[73] Assignee: Samsung Electronics Co., Ltd., Kyunggi, Rep. of Korea

[21] Appl. No.: 592,807

[22] Filed: Oct. 4, 1990

[30] Foreign Application Priority Data

May 21, 1990 [KR] Rep. of Korea .............. 90-7268[U]

[51] Int. Cl.$^5$ .............................................. H01 21/70
[52] U.S. Cl. ........................... 437/52; 437/47; 437/48; 437/60; 437/233; 437/919; 437/981
[58] Field of Search ............. 437/47, 51, 52, 60, 437/228, 233, 235, 981, 919; 148/DIG. 2; 357/23.6, 51; 156/644

[56] References Cited

U.S. PATENT DOCUMENTS

| 4,742,018 | 3/1988 | Kimura et al. | 357/23.6 |
| 4,910,566 | 3/1990 | Ema | 357/23.6 |
| 4,961,165 | 10/1990 | Ema | 357/23.6 |

FOREIGN PATENT DOCUMENTS 0293967  11/1988  Japan ................................ 437/919

*Primary Examiner*—Brian E. Hearn
*Assistant Examiner*—Tom Thomas

[57] ABSTRACT

The method comprises the steps of: forming the transistor on a substrate and then depositing an interlayer insulating layer, and forming a design pattern of a first conductive layer by vertically etching it using a mask; horizontally overetching the pattern by using the etching process used for forming the pattern; depositing a first insulating film and then depositing the second conductive layer to the thickness needed to protect the first insulating film; vertically etching the second conductive layer, first insulating film and interlayer insulating layer by applying the mask used in vertically etching the first conductive layer; additionally depositing the second conductive layer; forming a design pattern of the second conductive layer by vertically etching it using a mask; horizontally overetching the pattern of the second conductive layer; depositing the second insulating film and then depositing a third conductive layer to have the thickness to protect the second insulating film; vertically etching the third conductive layer and second insulating film by applying the etching mask of the second conductive layer; additionally depositing the third conductive layer. The method attains larger effective capacitance in which a plate electrode layer surrounds even the lower surface of a storage electrode layer of the stack capacitor without using any extra mask.

8 Claims, 8 Drawing Sheets

METHOD FOR MANUFACTURING A STACKED CAPACITOR DRAM CELL

FIELD OF THE INVENTION

The present invention relates to a method for manufacturing a semiconductor device, and more particularly to a method for manufacturing a capacitor having a very large integrating semiconductor memory device.

BACKGROUND INFORMATION

In recent years, in the area of semiconductor memory devices such as DRAM, 4M DRAM has been mass-produced and 16M DRAM has been actively studied. In other words, for 16M DRAM, the submicron stage represented by 4M DRAM is opened and a 3-dimensional device structure is introduced in addition to a reduction in conventional proportions, resulting in extreme fineness of materials.

In DRAM, according to the memory cell structure, the typical three dimensional structures such as a trench type and a stack type have been extensively studied. The trench type is manufactured in such a manner that a capacitor is formed inside the groove provided on the semiconductor substrate, and the stack type is constructed such that a capacitor is formed by laminating in three dimensions the conductive layers on the surface of the semiconductor substrate. Compared with stack type, the trench type has a more flat surface, resulting in advantages for lithography. But the trench type has disadvantages. First, the operation voltage is changed by leakage of current and punch-through between a trench and its neighboring trench. Also, there is the problem of electron-hole pairs generated by α-particles transmitted inside the substrate. The stack type is formed by laminating element layers on the substrate, so that the fabrication process sequence is simpler than that of trench type, and does not have the disadvantages of the trench type as stated above. As a result, the stack type is more profitable than the trench type.

To attain the required effective capacitance in the limited cell area, the stack type has to utilize the capacitor area maximally. In the conventional stack type, a thin insulating film covers the upper surface and the side surface of the storage electrode layer and then the plate electrode layer is formed on the thin insulating film. Therefore, because of the limited cell area resulting from the decreased cell size necessary to achieve VLSI, to maintain or increase effective capacitance, the height of the staked layers should be higher. This has the disadvantageous result of deteriorating the topography of the overall device.

SUMMARY OF THE INVENTION

It is an object of the present invention to provide a method of manufacturing a semiconductor device which provides a larger amount of effective capacitance because the plate electrode layer surrounds even the lower surface of the storage electrode layer of the capacitor, which thereby solves the problem of the conventional technique.

It is another object of the present invention to provide a method of manufacturing a semiconductor device with a plate electrode layer which surrounds even the lower surface of the storage electrode layer and can be formed simply without using any extra mask.

It is still another object of the present invention to provide a method of manufacturing a semiconductor device which makes possible the fabrication of a DRAM of 16M bit or more.

To achieve these stated objects, a method for manufacturing a semiconductor device which has a plurality of memory cells, each of which consists of a transistor and a stack capacitor, comprises the steps of:

forming the transistor on a semiconductor substrate by the conventional method of manufacturing transistors and then depositing an interlayer insulating layer on the whole surface;

depositing a first conductive layer on the whole surface of the interlayer insulating layer and then forming an etching pattern by using a mask to vertically etch the first conductive layer thereby forming a design pattern;

horizontally overetching the resultant design pattern of the first conductive layer by a wet etching process, using the same etching pattern used for vertically etching the first conductive layer;

depositing a thin first insulating film on the whole surface of the structure in which the horizontally overetched first conductive layer is formed, and then depositing a second conductive layer thick enough to protect the first insulating film;

vertically etching the second conductive layer, the thin first insulating film and the interlayer insulating layer by using the mask used in etching the first conductive layer so as to form a first contact hole to contact the transistor;

additionally depositing the same material as the second conductive layer in a predetermined thickness on the whole surface of the structure in which the contact hole is formed;

forming an etching pattern by using a mask to vertically etch the second conductive layer, thereby to form a design pattern;

horizontally overetching the second conductive layer by a wet etching process, using the same etching pattern used for vertically etching the second conductive layer;

depositing a thin second insulating film on the whole surface of the structure after removing the etching pattern of the second conductive layer, and then depositing a third conductive layer so as to have the thickness to protect the second insulating film;

partially exposing the surface of the first conductive layer by vertically etching the third conductive layer and the thin second insulating film by applying the same mask used in etching the second conductive layer; and additionally using the same materials used in the third conductive layer, depositing a layer of a predetermined thickness on the whole surface of the structure in a manner in which the partial surface of the first conductive layer remains exposed.

By adapting the above manufacturing method, using the same mask process as in the conventional method, even the lower surface of the storage electrode layer can be used as the effective area of the capacitor without using any extra mask.

Other features and advantages of the invention will be apparent from the following description taken in connection with the accompanying drawings.

DETAILED DESCRIPTION OF THE INVENTION

Figure 1A:
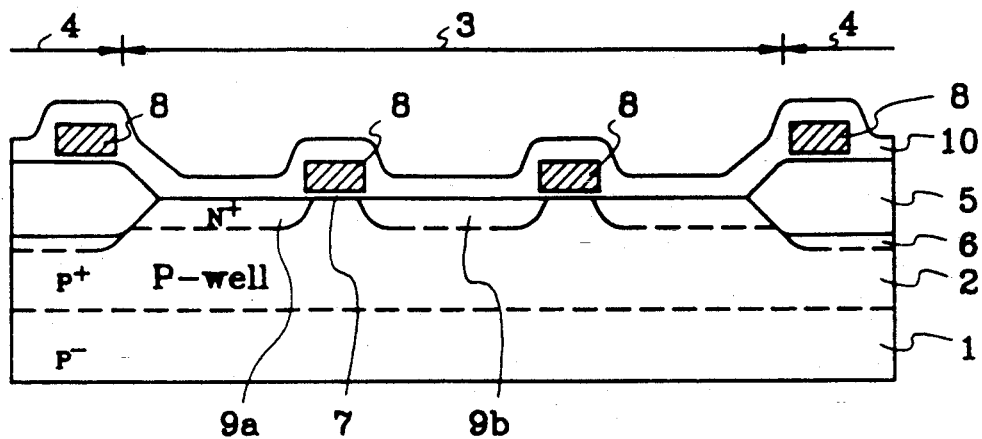
FIG. 1A to 1H illustrate the fabrication process sequence of the conventional 4M DRAM of stack type.

Referring to FIG. 1A, on a semiconductor substrate 1 weakly doped with P type impurity such as Boron, P type well 2 is formed by ion-implantation of a P type impurity. An active region 3 is defined through the photo lithography process. After ion-implantation of the P type impurity to the isolation region 4 is again applied, the field oxide layer 5 is deposited by thermal oxidation using the LOCOS method. By this thermal oxidation method, the P type well 2 is more deeply expanded into the semiconductor substrate 1, and P+ channel stop ion layer 6 is formed directly under the field oxide layer 5. In the active region 3, a polycrystalline silicon layer doped with N type impurity such as phosphorus forms the thin gate oxide film 7, which is deposited on the whole surface. The polycrystalline silicon layer is etched by the conventional photo lithography process so as to form the word line conductive layer 8 running in the vertical direction. This word line conductive layer 8 serves as the gate electrode layer in the active region 3 and serves as the conductive layer to connect the gate electrode layers on the field oxide layer 5. Ion-implantation of N+ type impurity such as phosphorus is carried out on the whole surface of the structure having the word line conductive layer 8, so that N+ ion layers 9a and 9b being self-aligned to the gate electrode layer, are formed in the active region 3. Thus, the N+ ion layer 9a, between the field oxide layer 5 and the gate electrode layer 8, serves as the source electrode layer and the N+ ion layer 9b, between gate electrode layers 8, serves as the drain electrode layer. As described above, the interlayer insulating layer 10, such as HTO, is deposited on the whole surface of the structure and the NMOS transistor is formed on the surface of the P type well 2 of the same structure.

Figure 1B:
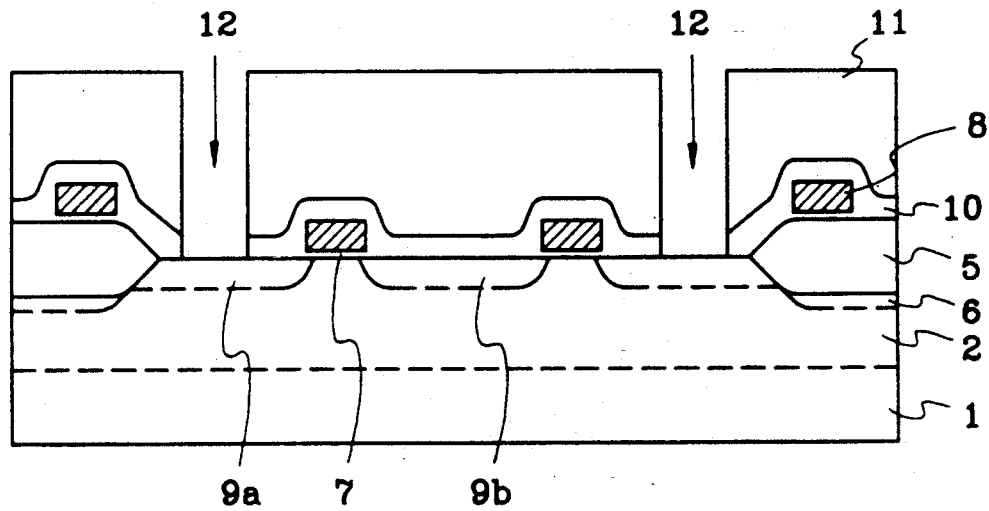

Referring to FIG. 1B, in order to cover with the resist the whole surface of the structure in which the interlayer insulating layer 10 is formed, and also to form the contact hole 12 on the surface of the N+ ion layer 9a which is provided as the source electrode layer, the interlayer insulating layer 10 is vertically etched by the conventional photo lithography process.

Figure 1C:
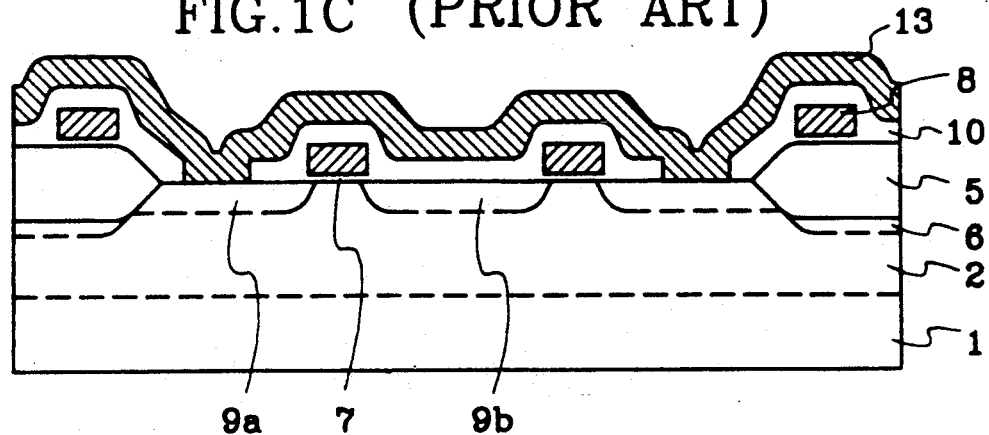

Referring to FIG. 1C, after forming the contact hole 12, the resist 11 is removed and then the polycrystalline layer 13 is deposited to form a thickness of 1500 to 2000 Å by the LPCVD method.

Figure 1D:
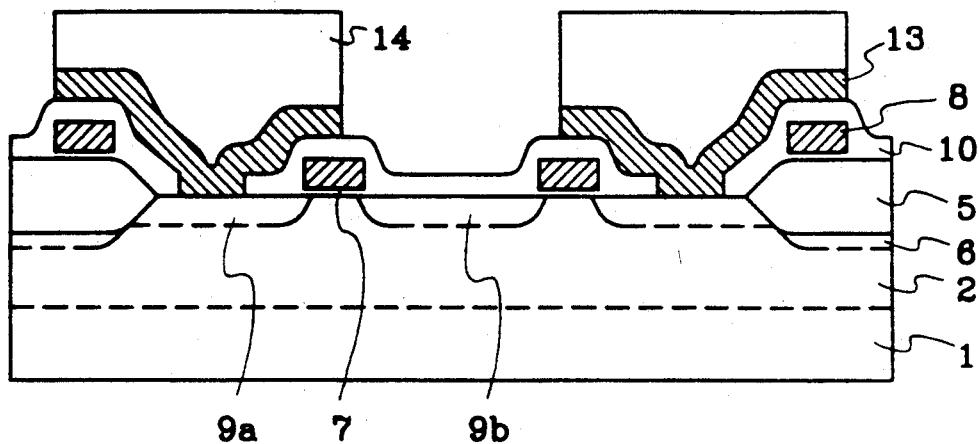

Referring to FIG. 1D, in order to cover the whole surface of the polycrystalline silicon layer 13 with resist 14 and form the storage electrode layer, the polycrystalline silicon layer 13 is vertically etched by the conventional photo lithography process. Accordingly, the polycrystalline silicon layer 13, located between a pair of word line conductive layers 8, and comprised of the gate electrode layer arranged on the active region 3 and the conductive layer arranged on field oxide layer 5, remains as the storage electrode layer.

Figure 1E:
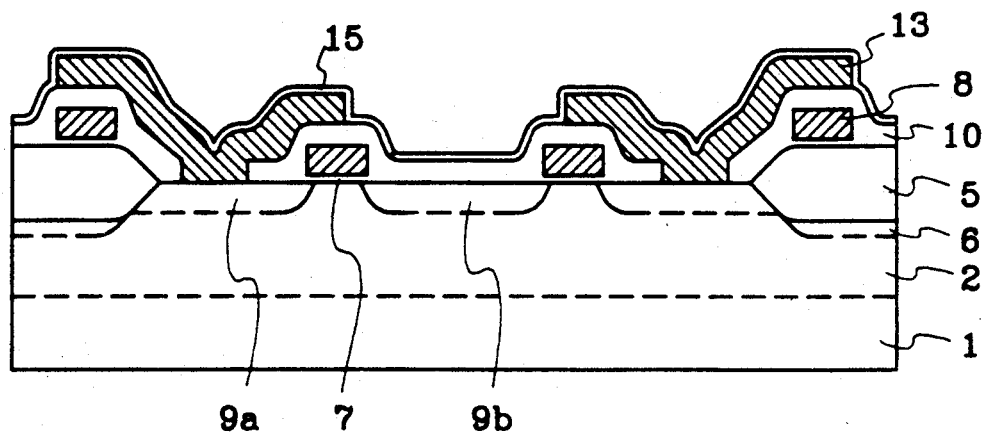

Referring to FIG. 1E, after forming the storage electrode layer, a thin insulating film 15 is deposited to a thickness of 60 to 80 Å on the whole surface of the structure. This insulating film 15 is comprised of a thermal oxide film and a nitride film laminated together. For example, ONO (Oxide silicon, Nitride silicon, Oxide silicon) film can be used. This insulating film serves as the dielectric film of the capacitor.

Figure 1F:
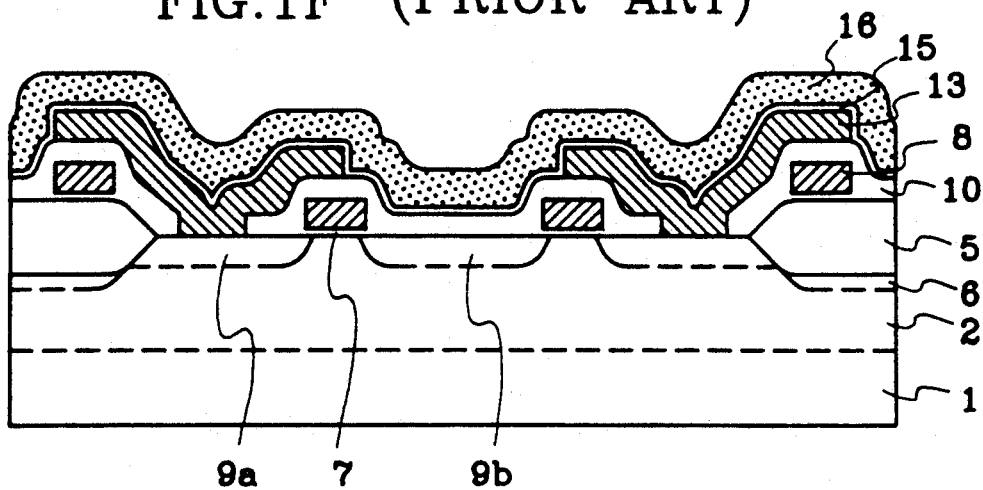

Referring to FIG. 1F, the N+ doped polycrystalline silicon layer 16 is deposited to a thickness of 1500 to 2000 Å on the whole surface of the insulating film 15 by the LPCVD method. This polycrystalline silicon layer 16 serves as the plate electrode layer of the capacitor.

Figure 1G:
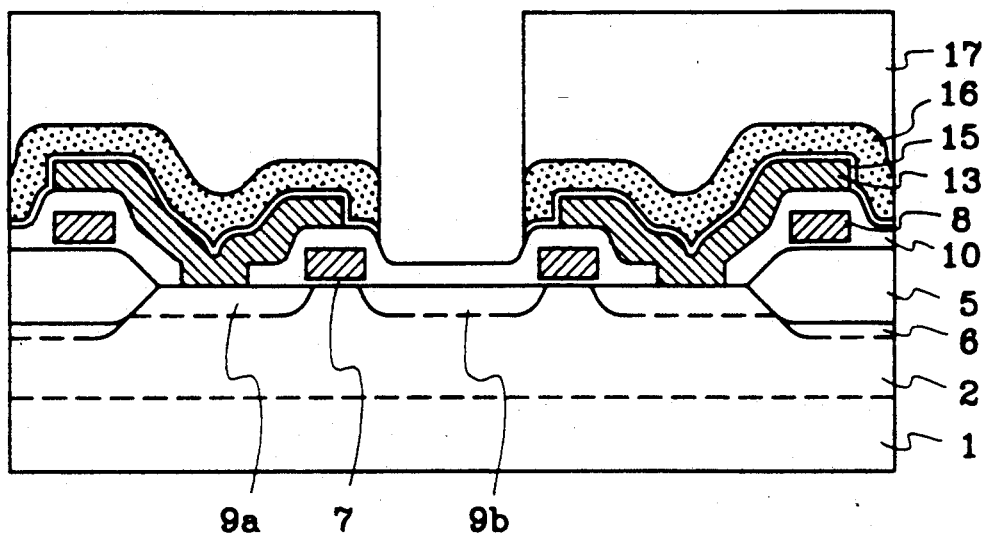

Referring to FIG. 1G, in order to insulate the plate electrode layer around the bit line contact hole, the structure is covered by the resist 17 and the polycrystalline silicon layer 16 is then vertically etched by the conventional photo lithography process.

Figure 1H:
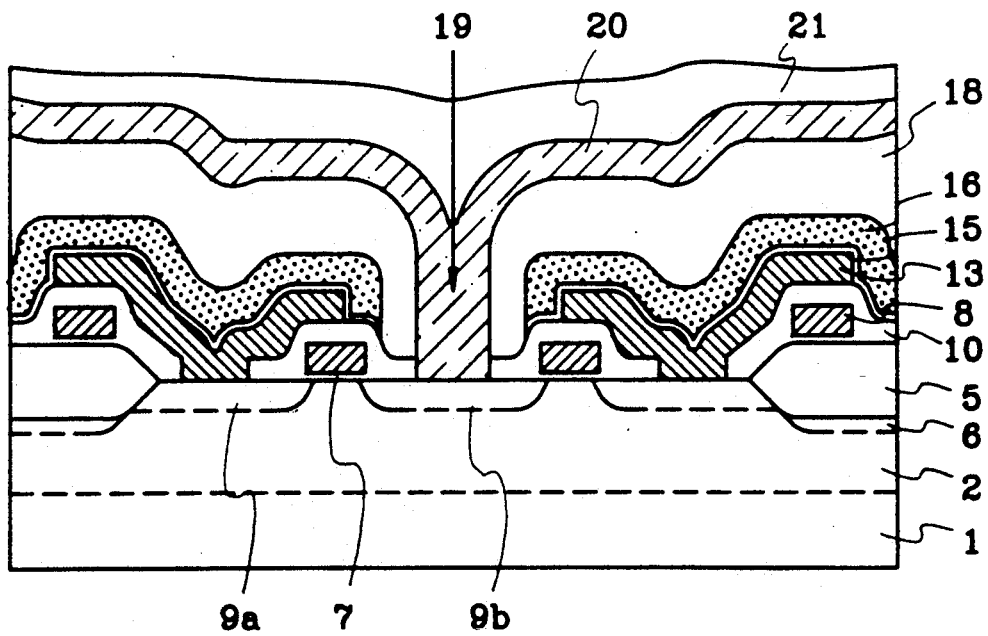

Referring to FIG. 1H, according to the conventional manufacturing process sequence of 4M DRAM, a glass flow layer 18, such as BPSG film, is deposited to flatten the surface and the bit line contact hole 19 is formed on the surface of the N+ ion layer 9b by the conventional photo lithography process. And then, after the bit line 20 is formed by the conventional metallization process, the surface is covered by passivation film 21 and then the chip is completed by the conventional fabrication process.

The above mentioned fabrication process sequence was explained in connection with the basic processes only to explain the function of the illustrated structures. Some processes were omitted in the explanation for the sake of simplicity.

The fabrication process sequence of the present invention will be explained by referring to FIGS. 2A to 2L. In the fabrication process sequence of the present invention, the same number of masks are used as are used in the fabrication process of 4M DRAM cell capacitor. The plate electrode layer of the present invention surrounds even the lower surface of the storage electrode layer, while also interposing the insulating film between itself and the storage electrode layer so as to increase the effective capacitance of the memory cell. Thus, 16M DRAM is easily achieved by applying the proportionally reduced dimension of 4M DRAM.

Figure 2A:
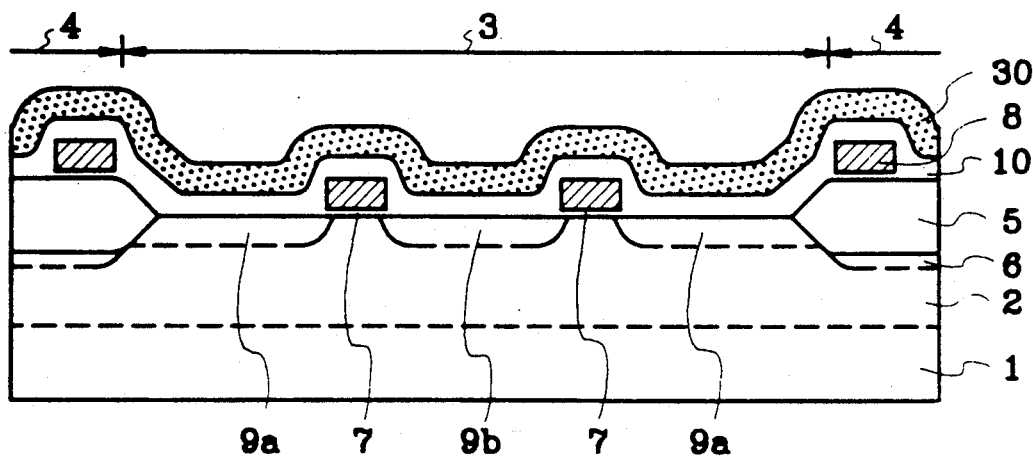
FIG. 2A to 2M illustrate the improved fabrication process sequence of a very large integrating DRAM according to the present invention.

Referring to FIG. 2A, after carrying out the process described in reference to FIG. 1A, N+ doped polycrystalline silicon layer 30, serving as a first conductive layer, is deposited on the whole surface of the resulting structure to the thickness of 1500 to 2000 Å by the LPCVD method.

Figure 2B:
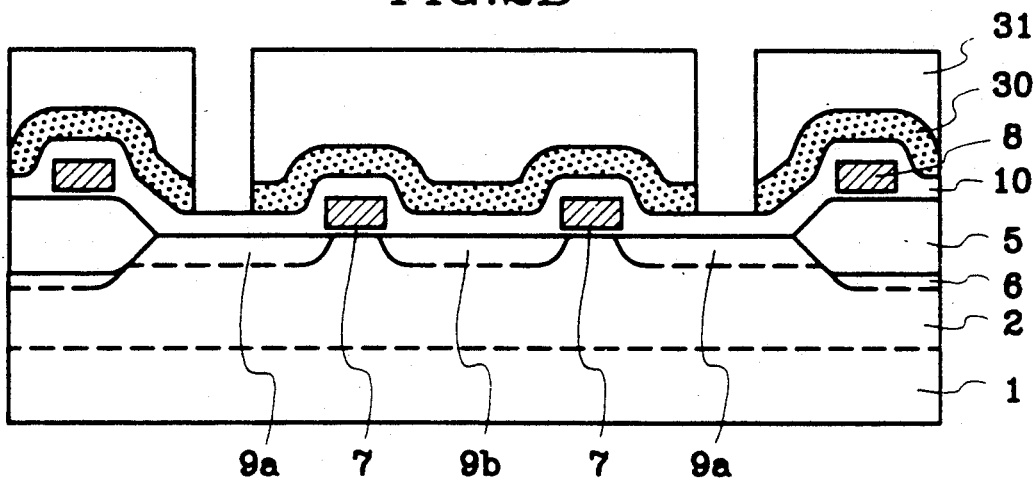

Referring to FIG. 2B, in order to form the polycrystalline silicon layer 30 into the predetermined pattern, the polycrystalline silicon layer is covered by resist 31, the mask of the contact hole is applied, and the resist 31 and the polycrystalline silicon layer 30 are vertically etched by the conventional photo lithography process.

Figure 2C:
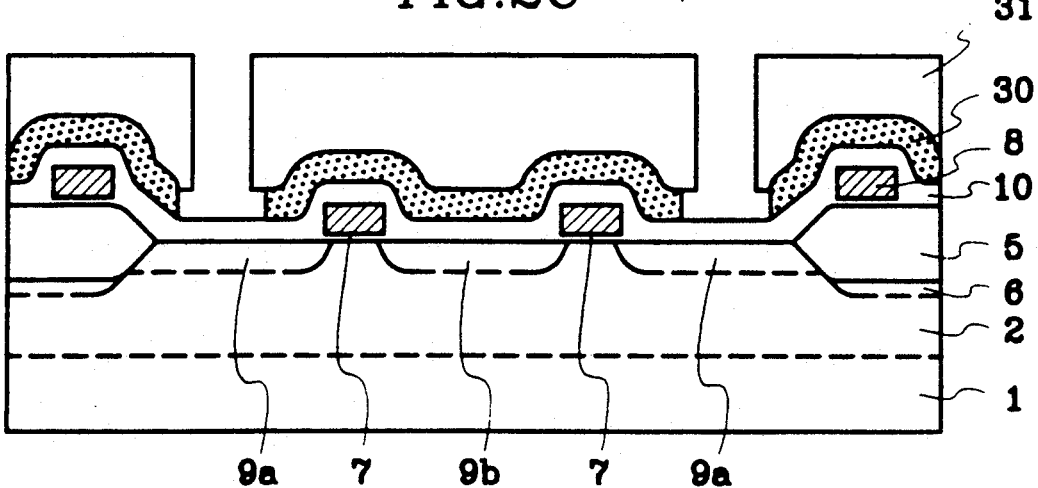

Referring to FIG. 2C following the vertical etching, the horizontal etching is carried out on the polycrystalline silicon layer 30, so that the exposed side of the resultant exposed polycrystalline silicon layer 30 is horizontally etched to a predetermined depth by keeping the etching pattern of the resist 31 in the original state. After the etching, the remaining pattern of polycrystalline silicon layer 30 serves as a partial electrode of the plate electrode layer as it surrounds the lower surface of the storage electrode layer of the cell capacitor.

Figure 2D:
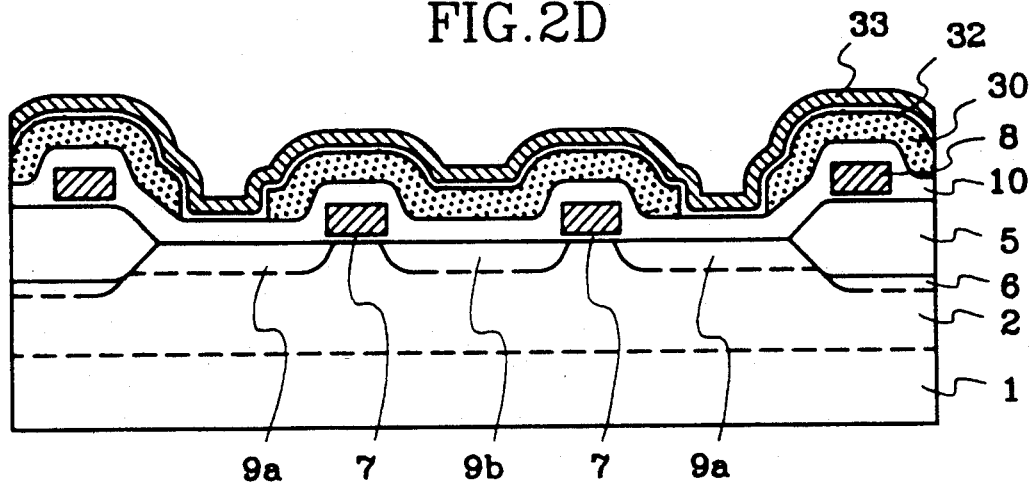

Referring to FIG. 2D, after removing the resist 31, the first thin insulating film 32 is deposited on the whole surface of the resulting structure, and then N+ doped polycrystalline silicon layer 33 serving as a second conductive layer is successively deposited. In this case, the first insulating film 32 has the thickness of about 60 to 80 Å, and the polycrystalline silicon layer 33 has a thickness of 300 to 500 Å in order to protect the first insulating film 32 in the next succeeding etching process.

Figure 2E:
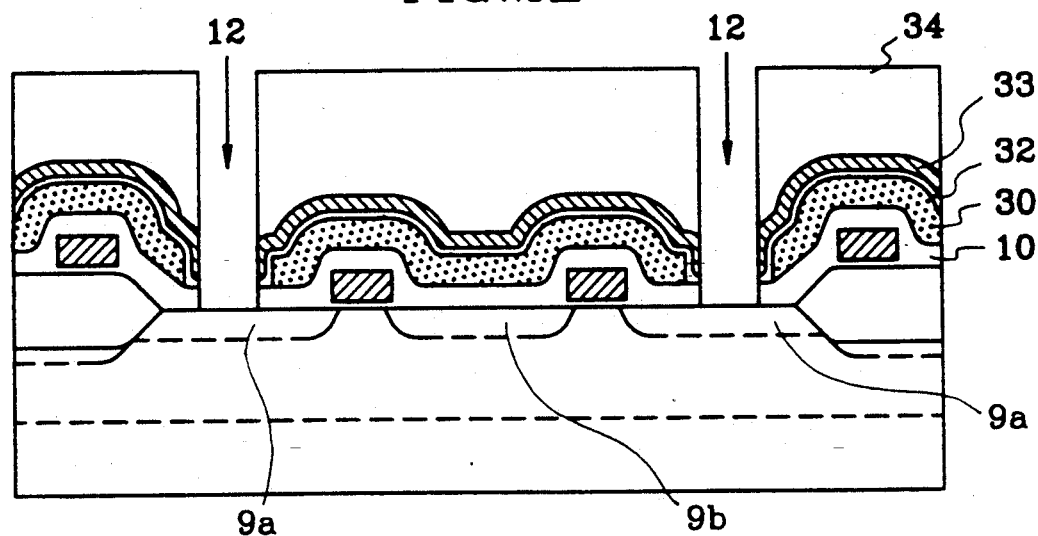

Referring to FIG. 2E, after the deposition of the polycrystalline silicon layer 33, the whole surface is covered by the resist 34, and then the polycrystalline silicon layer 33, the insulating film 32 and the interlayer insulating layer 10 are successively etched in the vertical direction using the contact hole mask which was used in the photo lithography process as illustrated in FIG. 2B. The result is that the contact hole 12 is formed to bring the storage electrode layer of the cell capacitor into contact with the source electrode layer 9a of the MOS transistor. The insulating film 32 is protected during the etching process by the polycrystalline silicon layer 33 which has a thickness of 300 to 500 Å.

Figure 2F:
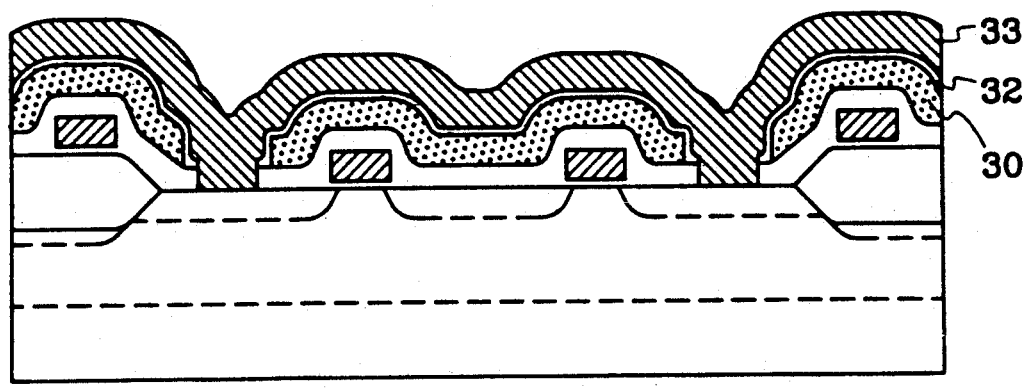

Referring to FIG. 2F, after the formation of the contact hole 12 on the source electrode layer 9a, the resist 34 is removed, after which the polycrystalline layer 33 is deposited to the predetermined thickness of 1500 to 2000 Å.

Figure 2G:
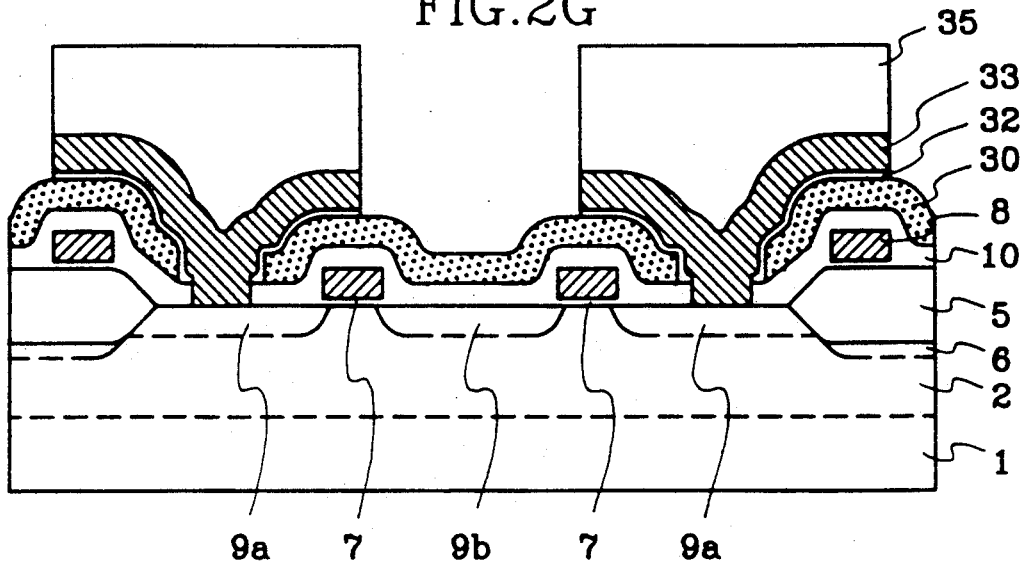

Referring to FIG. 2G, the polycrystalline layer 33 is covered by the resist 35, and then the polycrystalline silicon layer 33 is vertically etched by means of the mask of the storage electrode using the conventional photo lithography process.

Figure 2H:
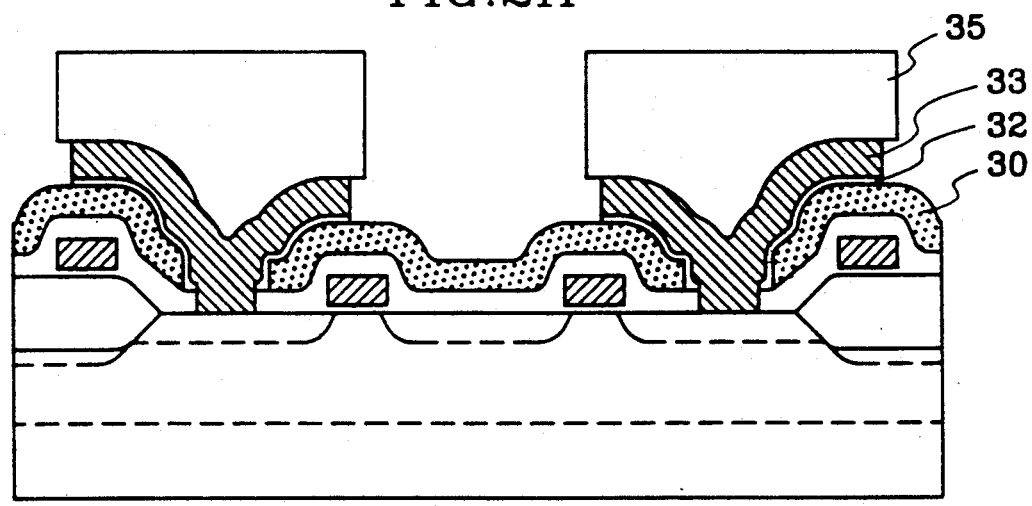

Referring to FIG. 2H, following the vertical etching process, the side surface of the polycrystalline silicon layer 33 is exposed to the outside by horizontally etching by wet etching horizontally to the predetermined depth.

Figure 2I:
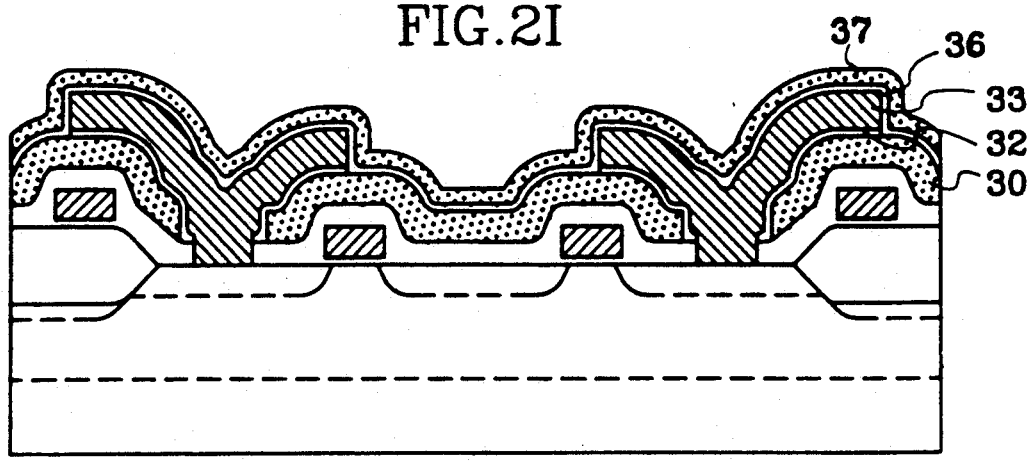

Referring to FIG. 2I, after the wet etching, the resist 35 is removed and then the thin second insulating film 36 is deposited on the whole surface of the remaining structure to the thickness of 60 to 80 Å, and then N+ doped polycrystalline silicon layer 37 serving as a third conductive layer is deposited to the thickness of 300 to 500 Å. This third conductive layer protects the second insulating film 36 during the etching process.

Figure 2J:
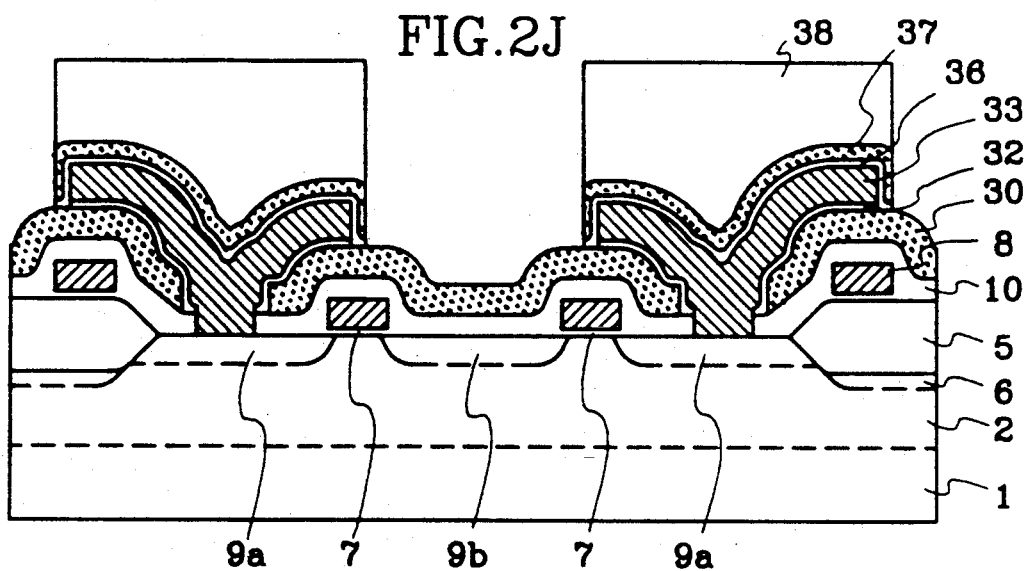

Referring to FIG. 2J, the whole surface of the above polycrystalline silicon layer 37 is covered by the resist 38, and then, by means of the above mentioned storage electrode mask, the surface of the polycrystalline silicon 30 is partially exposed by vertically etching the polycrystalline silicon layer 37 and the second insulating film 36 by the conventional photo lithography process.

Figure 2K:
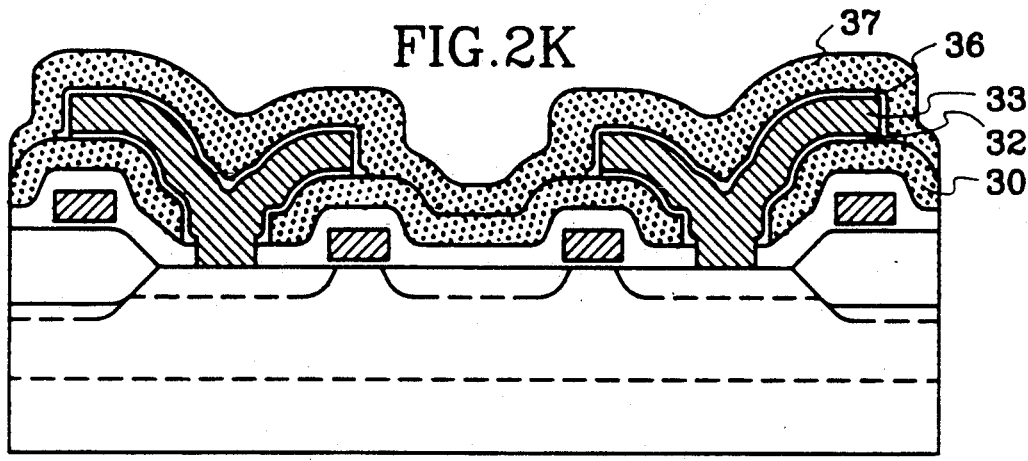

Referring to FIG. 2K, after the above exposure process, the resist 38 is removed, and then the polycrystalline silicon layer 37, having the thickness of 1500 to 2000 Å, is N+ doped over the whole surface of the structure by the LPCVD method so that the polycrystalline silicon layer 37 electrically contacts the polycrystalline silicon layer 30 which has the partially exposed surface.

Figure 2L:
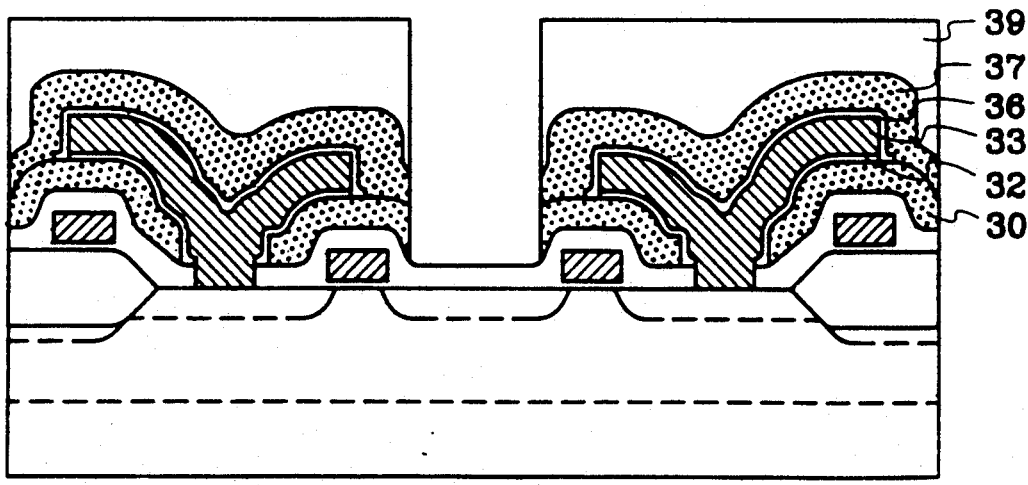

Referring to FIG. 2L, after the deposition of the above polycrystalline silicon layer 37, the whole surface of the structure is covered by the resist 39, and then by applying the mask of the plate electrode layer, the polycrystalline silicon layers 37 and 30 are vertically etched round the position where the bit line contact is to be located by the conventional photo lithography process.

Figure 2M:
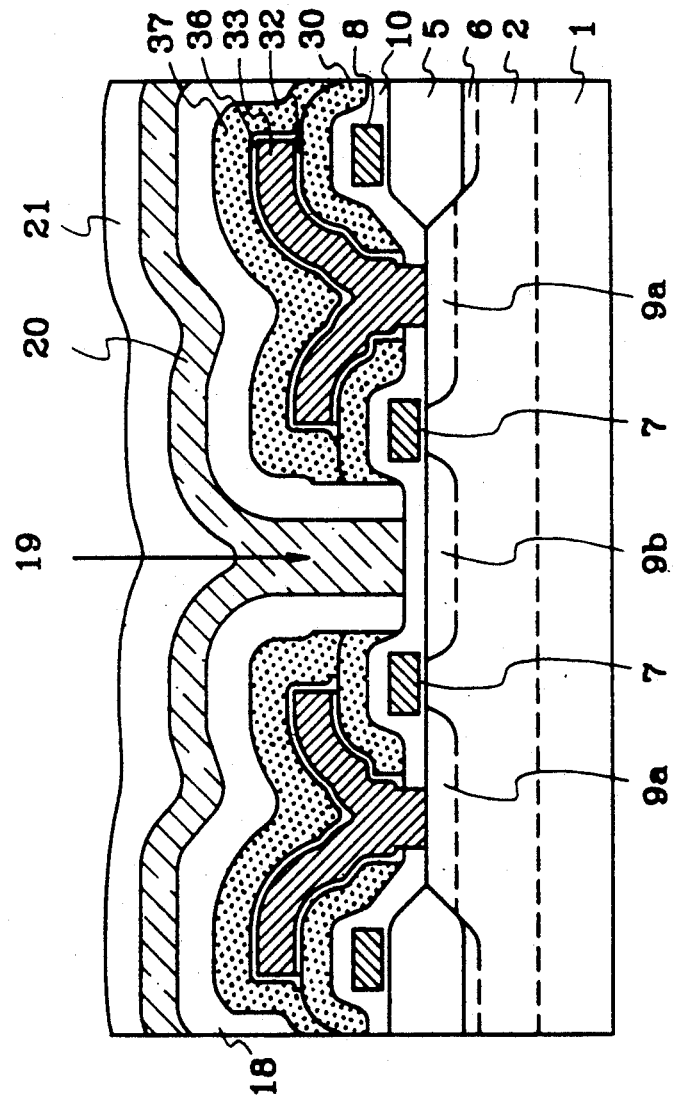

Referring to FIG. 2M, after the above etching process, the bit line 20 is formed by the same processes which are illustrated in FIG. 1H, so that the fabrication process is completed.

As described above, in the present invention, the manufacture of a cell capacitor of DRAM is accomplished by applying the manufacturing method of the conventional stack type 4M DRAM. The upper surface of the storage electrode layer are utilized as the effective area. Thus, by using the present manufacturing method of 4M DRAM, the capacitance of a memory cell can be increased to twice its conventional value. This means that 16M DRAM can be easily manufactured. Moreover, no extra mask is required because the horizontal etching by the wet etching method is used.

What is claimed is:

1. A method for manufacturing a semiconductor device having a plurality of memory cells, each of which consists of a transistor and a stack capacitor, said method comprising the steps of:
   (a) forming said transistor on a surface of a semiconductor substrate;
   (b) depositing an interlayer insulating layer on the surface of said substrate whereon the transistor has been formed in step (a);
   (c) depositing a first conductive layer on the surface of said substrate whereon the interlayer insulating layer has been deposited in step (b);
   (d) forming a design pattern on the first conductive layer by vertically etching an etching pattern from a mask onto the first conductive layer;
   (e) horizontally overetching the design pattern on the first conductive layer formed in step (d) by a wet etching process, using the etching pattern of step (d);
   (f) depositing a first thin insulating film on the surface of the substrate whereon the first conductive layer has been horizontally overetched in step (e),
   (g) depositing a second conductive layer on the first thin insulating film to provide sufficient thickness to protect the first insulating film;
   (h) vertically etching the second conductive layer, the first thin insulating film and the interlayer insulating layer with the mask used in etching the first conductive layer in step (d), wherein a first contact hole is formed to contact the transistor;
   (i) depositing a predetermined thickness of a material used in the second conductive layer on the surface of the substrate whereon the contact hole has been formed in step (h);
   (j) forming a design pattern by vertically etching an etching pattern from a mask onto the second conductive layer;
   (k) horizontally overetching the second conductive layer by a wet etching process, using the etching pattern of step (j);
   (l) depositing a thin second insulating film on the whole surface of the structure after removing the second conductive layer;
   (m) depositing a sufficient thickness of a third conductive layer to protect the second insulating film;
   (n) partially exposing a surface of the first conductive layer by vertically etching the third conductive layer and the thin second insulating film by applying the mask used in etching the second conductive layer in step (j); and
   (o) depositing a predetermined thickness of a material used in the third conductive layer on the surface of the substrate partially exposed in step (n) so that a surface of the first conductive layer is partially exposed.

2. A method for manufacturing a semiconductor device as set forth in claim 1, wherein said first and second insulating films are formed by laminating thermal oxide films and nitride films.

3. A method for manufacturing a semiconductor device as set forth in claim 2, wherein said first to third conductive layers are comprised of polycrystalline silicon doped with impurity.

4. A method for manufacturing a semiconductor device as set forth in claim 3, wherein said first and second insulating films are from 60 to 80 Å in thickness.

5. A method for manufacturing a semiconductor device as set forth in claim 4, wherein the thicknesses of the first and third conductive layers are from about 300 to 500 Å, sufficient protect said first and second insulating films.

6. A method for manufacturing a semiconductor device as set forth in claim 5, wherein the predetermined thicknesses of the first and third conductive layers are from about 1500 to 2000 Å.

7. A method for manufacturing a semiconductor device as set forth in claim 1, wherein said transistor is a MOS transistor.

8. A method for manufacturing a semiconductor device as set forth in claim 7, wherein said method additionally comprises the steps of:
 depositing a layer of BPSG film on the whole surface of said third conductive layer;
 vertically etching said layer of BPSG film, the third and the first conductive layers and the interlayer insulating film, so as to form the second contact hole in order to contact said transistor; and
 forming a bit line of said memory cell on the structure whereon said second contact hole is located by using a metallization process.

* * * * *